United States Patent

Ghilardelli et al.

[11] Patent Number: 6,064,598
[45] Date of Patent: May 16, 2000

[54] SWITCHING CIRCUIT

[75] Inventors: Andrea Ghilardelli, Cinisello Balsamo; Carla Maria Golla, Sesto San Giovanni; Matteo Zammattio, Milan; Stefano Zanardi, Seriate, all of Italy

[73] Assignee: STMicroelectronics, S.r.l., Agrate Brianza, Italy

[21] Appl. No.: 09/275,694

[22] Filed: Mar. 24, 1999

[30] Foreign Application Priority Data

Mar. 27, 1998 [IT] Italy .................................. MI98A0641

[51] Int. Cl.[7] .................................................. G11C 16/04
[52] U.S. Cl. ...................................... 365/185.33; 365/154
[58] Field of Search ......................... 365/185.33, 185.07, 365/154, 156

[56] References Cited

U.S. PATENT DOCUMENTS

| | | | |
|---|---|---|---|
| 5,392,253 | 2/1995 | Atsumi et al. ...................... | 365/230.06 |
| 5,581,503 | 12/1996 | Matsubara et al. ................. | 365/185.33 |
| 5,592,419 | 1/1997 | Akaogi et al. ...................... | 365/185.18 |
| 5,617,369 | 4/1997 | Tomishima et al. ................ | 365/230.06 |
| 5,757,696 | 5/1998 | Matsuo et al. ..................... | 365/185.07 |
| 5,943,273 | 8/1999 | Hidaka et al. ...................... | 365/189.11 |
| 5,982,705 | 11/1999 | Tsukikawa .......................... | 365/230.08 |

*Primary Examiner*—David Nelms
*Assistant Examiner*—Anh Phung
*Attorney, Agent, or Firm*—Theodore E. Galanthay; E. Russell Tarleton; Seed IP Law Group, PLLC

[57] ABSTRACT

A switching circuit comprising a supply voltage, a reference voltage, a line suitable to carry a negative voltage, an input for a control signal, suitable to supply to a first output node and to a second output node two voltages respectively equal to supply voltage and to line voltage or, alternatively, to line voltage and to supply voltage, in response to the control signal. There are first interrupting means, second interrupting means, third interrupting means, fourth interrupting means, the first and third interrupting means connected in series between the supply voltage and the line, the second and fourth interrupting means connected in series with each other and in parallel to first and third interrupting means, the first output node corresponding to common node between the first interrupting means and the third interrupting means, the second output node corresponding to common node between the second interrupting means and the fourth interrupting means, the control signal controlling first interrupting means and second interrupting means in such a way that when the first interrupting means are open, also the fourth interrupting means are open whereas the second interrupting means and third interrupting means are closed, connecting the first output node to line and the second output node to supply voltage, and vice versa when the first interrupting means are closed, also fourth interrupting means are closed whereas the second interrupting means and third interrupting means are open, connecting the first output node to supply voltage and the second output node to line.

20 Claims, 2 Drawing Sheets

SWITCHING CIRCUIT

TECHNICAL FIELD

The present invention relates to a switching circuit. Particularly, it relates to a circuit with two output voltages changing alternatively between a supply voltage (VDD) and a negative value voltage (VNEG) but which can be also ground without creating problems inside the circuit.

BACKGROUND OF THE INVENTION

In EEPROM or Flash EEPROM non-volatile memory devices, it is possible electrically to write, to read and to erase the elementary memory cells which constitute them: particularly, the erasure of the Flash EEPROM memories consists of an operation that lowers the threshold voltage value of the memory cells, extracting the negative charge stored in the floating gate.

Such an erasing operation can be performed by means of a technique wherein the source electrode of the memory cells is carried to a voltage level near the supply voltage and a negative voltage is applied to the control gate electrode, always keeping not connected the drain electrode.

The management of the voltage negative values in a circuit manufactured in CMOS technology can be difficult, because it can be not possible to apply negative voltages with suitable values to the source or drain electrodes of the N channel MOSFET, without forward biasing the source/substrate or drain/substrate junctions, the substrate of the integrated circuit being rigidly connected to ground.

Such a problem is solved using a CMOS technology which allows to insulate the bulk electrode of the N channel MOSFET transistors from the device substrate, necessarily connected to ground.

FIG. 1 shows, for example, the section view of a N channel MOS transistor manufactured in triple well technology, and FIG. 2 shows the circuit symbol which represents such transistor. In FIG. 1 there is a P type deep substrate 1 connected to ground, wherein a N type well 2 is obtained and it is connected to the supply voltage VDD; inside it there is another P type well 3 with two N+ doped zones corresponding to the drain and source electrodes; the well 3 electrode is connected to the source electrode. The substrate 1 and the wells 2 and 3 are connected to their external electrodes through contact regions which have a higher doping.

By means of this triple well technology the N channel MOSFET has such N well 2 that by applying positive supply voltage VDD to this well it is possible to inversely bias all the parasitic junctions existing inside the structure, even when negative voltages are applied to the source electrode, connected to the bulk electrode 3 of the same transistor.

It is desired, then, that inside the Flash EEPROM memory there are switching circuits able to supply out voltage values equal to the supply voltage and to the negative voltage, in order to allow the correct control of all the analogue circuitry.

SUMMARY OF THE INVENTION

In view of the state of the art described, it is an object of the present invention to provide a switching circuit able to supply out two output voltages alternatively equal to the supply voltage and to a negative voltage, without meeting the above-mentioned problems.

According to the present invention, such an object is achieved by means of a switching circuit comprising a supply voltage, a reference voltage, a line suitable to carry a negative voltage, an input for a control signal, suitable to supply to a first output node and to a second output node two voltages respectively equal to said supply voltage and to the voltage of said line or, alternatively, to the voltage of said line and to said supply voltage, in response to said control signal, characterized by comprising first interrupting means, second interrupting means, third interrupting means, fourth interrupting means, said first and third interrupting means, connected in series between said supply voltage and said line, said second and fourth interrupting means connected in series with each other and in parallel to said first and third interrupting means, said first output node corresponding to common node between said first interrupting means and said third interrupting means, said second output node corresponding to common node between said second interrupting means and said fourth interrupting means, said control signal controlling said first interrupting means and said second interrupting means in such a way that when said first interrupting means are open, also said fourth interrupting means are open whereas said second interrupting means and said third interrupting means are closed, connecting said first output node to said line and said second output node to said supply voltage, and vice versa when said first interrupting means are closed, also said fourth interrupting means are closed whereas said second interrupting means and said third interrupting means are open, connecting said first output node to said supply voltage and said second output node to said line.

BRIEF DESCRIPTION OF THE DRAWINGS

The features and advantages of the invention will be made apparent by the following detailed description of two embodiments thereof, illustrated as nonlimiting examples in the annexed drawings, wherein.

DETAILED DESCRIPTION OF THE INVENTION

Figure 1:
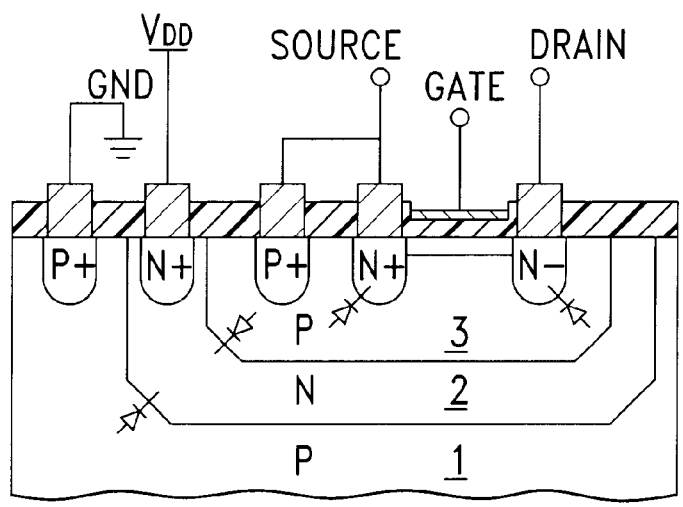
FIGS. 1 and 2 show respectively the section view and the circuit symbol of a N channel MOS transistor manufactured in triple well technology, usable in an embodiment of the present invention.
Figure 2:
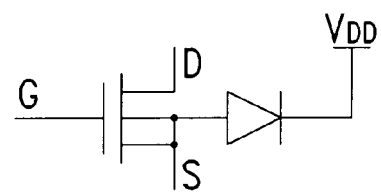
Figure 3:
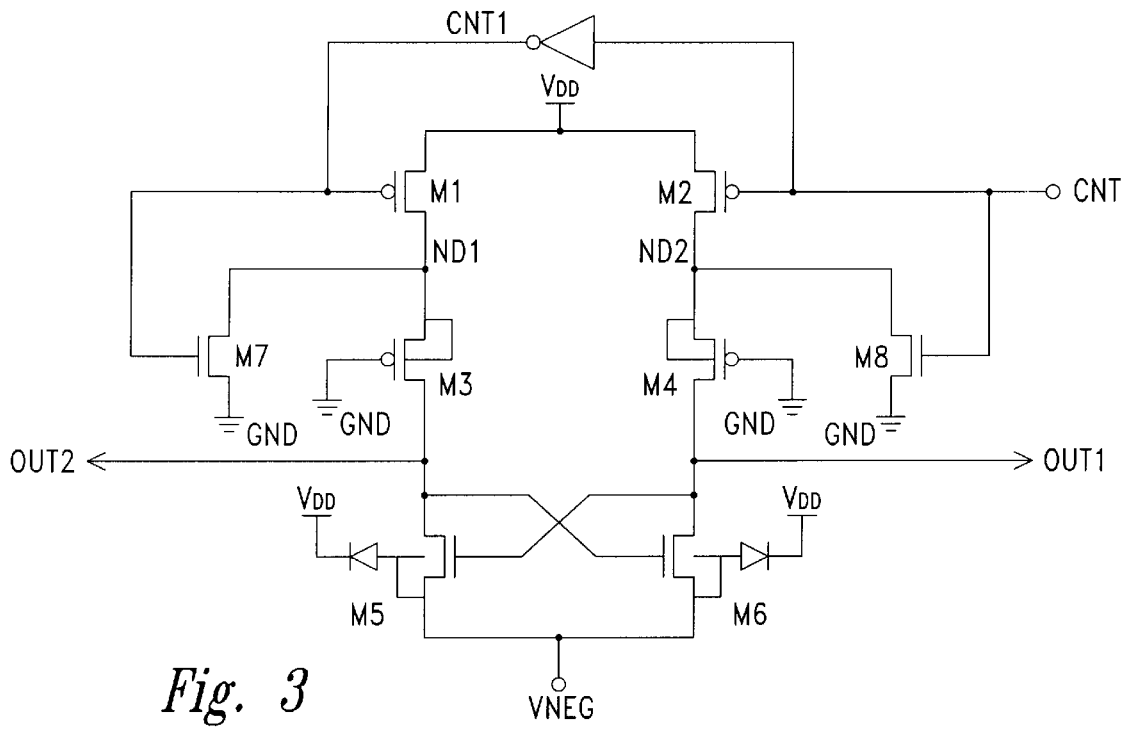
FIG. 3 is a circuit diagram of a switching circuit according to a first embodiment of the present invention.

Referring to the drawings, FIG. 3 shows a circuit diagram of a switching circuit according to a first embodiment of the present invention; such circuit receives a control logic signal CNT, it supplies out two signals OUT1 and OUT2, it is connected between a supply voltage VDD and a reference voltage (ground=GND), and it receives also a voltage VNEG, which can be a negative one or ground.

The circuit has a symmetrical structure and comprises a couple of P channel MOSFET, M2 and M1, with the source electrode connected to the supply voltage VDD and controlled by the control signal CNT and its logic complement CNT1, respectively. The signal CNT and its complement CNT1 control respectively also two N channel MOSFET, M8 and M7, which have the source electrodes connected to ground and the drain electrodes connected respectively to the drain electrodes of the two MOSFET M2 and M1, indicated in figure with the node ND2 and ND1.

Also the source electrodes and the n-well of two P channel MOSFET, M4 and M3 are connected to nodes ND2 and ND1, respectively, and said two P channel MOSFET have the gate electrodes connected to ground. The drain electrodes of the transistors M4 and M3 correspond to the output nodes OUT1 and OUT2, respectively.

Moreover, the circuit comprises also two N channel MOSFET, M6 and M5, manufactured in triple well technology, with their source connected to voltage VNEG. The gate electrode of the transistor M5 is connected, together with the drain electrode of the transistor M6, to the output node OUT1 and symmetrically the gate electrode of the transistor M6 is connected, together with the drain electrode of the transistor M5, to the output node OUT2. Then, the transistors M5 and M6 form a "latch" structure.

It can be analyzed in detail the working of such a circuit.

In case the control signal CNT is at high logic level (usually with value equal to VDD), the transistor M2 is off whereas the transistor M8 is on and the node ND2 has a voltage value equal to the reference voltage (GND). The transistor M4 is off and disconnects the node ND2 from the output node OUT1.

The transistor M1, being controlled by the complementary signal CNT1 of the input signal, is on whereas the transistor M7 is off and as a consequence the node ND1 has a voltage equal to VDD. Such a value arranges for the transistor M3 to be on and so the output node OUT2 has a voltage equal to VDD. The output node OUT2, controlling the transistor M6, switch it on and so the output node OUT1 assumes a voltage value equal to VNEG. The transistor M5 is off.

The choice of biasing to ground the N type semiconductor well (n-well) wherein the transistor M4 is formed, rather than to the supply voltage VDD, depends on the stress of the n-well/OUT1 junction of M4 that in this way carries a potential difference equal to VNEG instead of |VNEG|+ VDD, if its well is biased at VDD.

At this point, for reversing the outputs in order to obtain a voltage value equal to VDD in the output node OUT1, and a voltage value equal to VNEG in the output node OUT2, it is necessary that the control signal CNT is carried to low logic level: due to the structure symmetry, all the transistors that were on now are off and vice versa the off ones are now on, so allowing to the output nodes to assume the desired voltage values.

The same considerations mentioned about the transistor M4 junctions can be now transferred to the transistor M3, in a symmetrical way: then, the maximum potential difference carried by the P channel MOSFET junctions of the circuit is equal to VNEG and so such junctions are electrically little stressed, with the advantage of not meeting the undesired breakdown effects.

The transistors M7 and M8 are designed to be enough resistive for obtaining a correct working of the circuit during the transitory step, for reversing the outputs from a situation to the other: for example, for carrying the outputs OUT1 and OUT2 to the final values of VDD and VNEG respectively, the node OUT2 spends a determined time for passing from VDD to VNEG; the n-well of M3 must be biased to ground, but not before that the node OUT2 is passed from VDD at least to ground in order to avoid that the drain/n-well junction of M3 is inversely biased. This is assured by the high resistivity of M7 that discharges slowly the node to which the n-well of M3 is connected.

Moreover, according to one embodiment, for switching the outputs it is preferred that the transistors M5 and M6 are formed in a such manner that they are more resistive than the couple of transistors M1 and M3 and than the couple of transistors M2 and M4, respectively: in fact, in the situation, for example, of reversing the outputs so that the node OUT1 switches from the voltage VNEG to the voltage VDD, the transistors M2 and M4 are more conductive than the transistor M6, i.e., that the last is more resistive than the other two. The transistor M6 is preferred to be the more resistive the higher is the negative voltage VNEG value because this voltage controls it.

Figure 4:
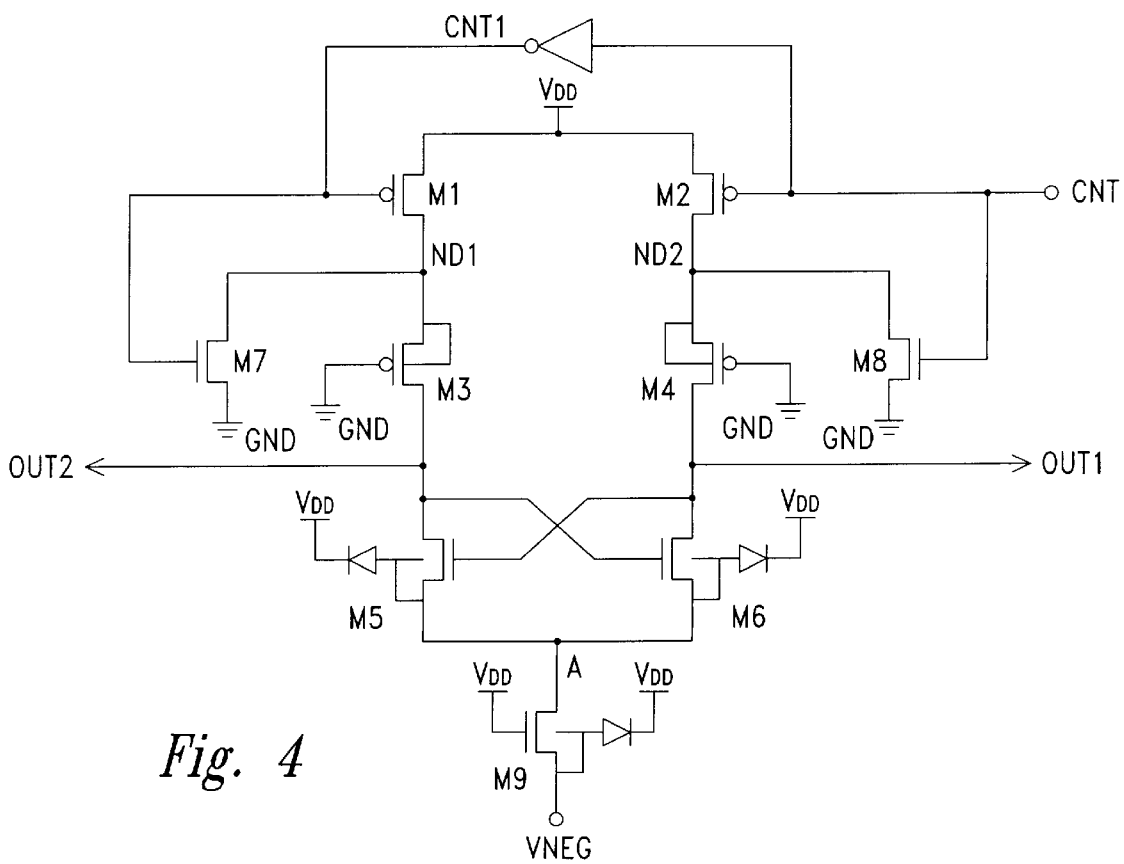
FIG. 4 is a circuit diagram of a switching circuit according to a second embodiment of the present invention.

FIG. 4 is a circuit diagram of a switching circuit according to a second embodiment of the present invention: the structure is equal to that of the circuit in FIG. 3 except for the introduction, between the two MOSFET M5 and M6 at a side and the voltage VNEG at the other side, of a further N channel MOS transistor, M9, manufactured in triple well technology and well resistive, with a first electrode connected to the source node (node A) common to the two MOSFET M5 and M6, a second electrode connected to voltage VNEG and the control electrode connected to the supply voltage VDD.

The working of the circuit is similar to that previously described: the addition of the resistive MOSFET M9 simplifies the switching because it limits the crowbar current during the switching and this allows to obtain transistors M5 and M6 not so much resistive. The switching of the circuit is however assured, because the presence of resistive MOSFET M9 increases (decreases in modulus) the node A voltage during the switching due to the crowbar current, so that the control voltage VGS of the MOSFET M5 and M6 decreases, subsequently decreasing their conductivity and helping the couples of transistors M1–M3 and M2–M4 to "overcome" M5 and M6, respectively.

The circuit switching is faster because, the MOSFET M9 being the transistor limiting the current, the MOSFET M5 and M6 can be manufactured more conductive than the first embodiment of FIG. 3, so allowing a faster switching.

Moreover, during the switching the crowbar current decreases in comparison with the previous case because the current is limited by MOSFET M9 and the switching is faster and so the crowbar current appears for less time.

In case of using only one of the two outputs, the switching circuit could be considered a voltage level translator circuit in case the output is OUT2, or an inverting level translator in case the output is OUT1.

What is claimed is:

1. A switching circuit for use with a supply voltage, a reference voltage, a line suitable to carry a negative voltage, and a control signal, the circuit comprising an input for the control signal; first interrupting means; second interrupting means; third interrupting means; and fourth interrupting means; said first and third interrupting means connected in series between said supply voltage and said line, said second and fourth interrupting means connected in series with each other and in parallel to said first and third interrupting means, a first output node corresponding to a common node between said first interrupting means and said third interrupting means, a second output node corresponding to a common node between said second interrupting means and said fourth interrupting means; said control signal controlling said first interrupting means and said second interrupting means in such a way that when said first interrupting means are open, also said fourth interrupting means are open, whereas said second interrupting means and said third interrupting means are closed to connect said first output node to the line and said second output node to the supply voltage; and when said first interrupting means are closed, also said fourth interrupting means are closed, whereas said second interrupting means and said third interrupting means are open to connect said first output node to said supply voltage and said second output node to said line.

2. The circuit according to claim 1 wherein said first interrupting means comprise fifth interrupting means and sixth interrupting means, both controlled by a logic complement of said control signal, and said second interrupting means comprise seventh interrupting means and eighth interrupting means, both controlled by said control signal.

3. The circuit according to claim 2 wherein:

said fifth interrupting means comprise a first MOSFET, with a first electrode connected to said supply voltage, a second electrode connected, through a first node, to said sixth interrupting means, and the control electrode controlled by said logic complement of said control signal;

said seventh interrupting means comprise a second MOSFET, with a first electrode connected to said supply voltage, a second electrode connected, through a second node, to said eighth interrupting means, and the control electrode controlled by said control signal.

4. The circuit according to claim 3 wherein:

said sixth interrupting means comprise a third MOSFET, with a first electrode connected to said first node, a second electrode connected to said first output node and the control electrode connected to said reference voltage, a fourth MOSFET, with a first electrode connected to said first node, a second electrode connected to said reference voltage and the control electrode controlled by said logic complement of said control signal;

said eighth interrupting means comprise a fifth MOSFET, with a first electrode connected to said second node, a second electrode connected to said second output node and the control electrode connected to said reference voltage, a sixth MOSFET, with a first electrode connected to said second node, a second electrode connected to said reference voltage and the control electrode controlled by said control signal.

5. The circuit according to claim 4 wherein:

said third interrupting means comprise a seventh MOSFET, with a first electrode connected to said first output node, a second electrode connected to said line and the control electrode connected to said second output node;

said fourth interrupting means comprise an eighth MOSFET, with a first electrode connected to said second output node, a second electrode connected to said line and the control electrode connected to said first output node.

6. The circuit according to claim 5 wherein said first, second, third and fifth MOSFET are P channel MOSFET, and said fourth, sixth, seventh and eighth MOSFET are N channel MOSFET.

7. The circuit according to claim 6 wherein said seventh and eighth MOSFET are manufactured in triple well technology.

8. The circuit according to claim 7 wherein said third and fifth MOSFET have the n-well connected to the source electrode.

9. The circuit according to claim 8 wherein said control signal switches between said reference voltage and said supply voltage.

10. A switching circuit, comprising:

a latch having a first terminal connected to a first output node, a second terminal connected to a second output node, and a third terminal coupled to a voltage line;

a first switch circuit having a first terminal connected to a source voltage and a second terminal connected to the first output node;

a second switch circuit having a first terminal connected to the source voltage and a second terminal connected to the second output node; and a control line having a first terminal connected to the first switch circuit and a second terminal connected to the second switch circuit and configured to selectively provide an uncomplemented control signal to one of the first and second switch circuits and a complemented control signal to the other of the first and second switch circuits to connect the supply voltage to one of the first and second output nodes and the voltage line to the other of the first and second output nodes.

11. The circuit of claim 10 wherein the first switch circuit comprises first and second transistors in series, the first transistor having a first terminal connected to the supply voltage, a second terminal connected to a first node, and a control terminal connected to the first terminal of the control line, and the second transistor having a first terminal connected to the first node, a second terminal connected to the first output node, and a control terminal connected to a reference voltage; and the second switch circuit having third and fourth transistors connected in series, the third transistor having a first terminal connected to the supply voltage, a second terminal connected to the second node, and a control terminal connected to the second terminal of the control line, and the fourth transistor having a first terminal connected to the second node, the second terminal connected to the second output node, and a control terminal connected to the reference voltage.

12. The circuit of claim 11 wherein the first switch circuit further includes a seventh transistor having a first terminal connected to the first node, a second terminal connected to the reference voltage, and a control terminal connected to the first terminal of the control line; and the second switch further include an eighth transistor having a first terminal connected to the second node, a second terminal connected to the reference voltage, and a control terminal connected to the second terminal of the control line.

13. The circuit of claim 12 wherein the seventh and eighth transistors are configured to have a resistivity that discharges the first node and the second node, respectively, at a rate sufficient to permit voltage at the first and second output nodes, respectively, to change from the supply voltage to at least the reference voltage before an n-well of the second and fourth transistor, respectively, is biased to ground.

14. The circuit of claim 10 wherein the latch comprises fifth and sixth transistors.

15. The circuit of claim 14 wherein the fifth and sixth transistors have a resistivity greater than the resistivity of the first and second transistors in the first switch circuit and the third and fourth transistors in the second switch circuit to facilitate changing of voltage at the first and second output nodes from at least the voltage level of the voltage line to the voltage level of the supply voltage.

16. The circuit of claim 15 wherein the fifth and sixth transistors are manufactured in triple well technology.

17. The circuit of claim 10 wherein the latch is coupled to the voltage line via a ninth transistor having a first terminal connected to the latch, a second terminal connected to the voltage line, and a control terminal connected to the supply voltage.

18. The circuit of claim 10 wherein the voltage line is connected to one of either a reference voltage and a negative voltage source that is more negative than the reference voltage.

19. A switching circuit, comprising:

a first output terminal connected to a first node;

a second output terminal connected to a second node;

a latch having first and second control terminals connected to the first and second nodes and a first voltage input terminal connected to a first voltage source; and a switch circuit connected to the first and second nodes and having a second voltage input terminal connected to a second voltage source and a control input terminal connected to a control signal, the switch circuit and the latch configured to couple the first output terminal to the first voltage source and the second output terminal to the second voltage source in response to a control signal at a first state, and to couple the first output terminal to the second voltage source and the second output terminal to the first voltage source when the control signal is at a second state that is the complement of the first state.

20. The switching circuit of claim 19 wherein the latch further comprises first and second transistors manufactured in triple well technology.

* * * * *